(12) United States Patent
Siddik et al.

(10) Patent No.: US 9,331,269 B2
(45) Date of Patent: May 3, 2016

(54) SPIN TRANSFER TORQUE MEMORY CELLS

(71) Applicant: Micron Technology, Inc., Boise, ID (US)

(72) Inventors: Manzar Siddik, Singapore (SG); Witold Kula, Gilroy, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/448,343

(22) Filed: Jul. 31, 2014

(65) Prior Publication Data

US 2015/0303374 A1    Oct. 22, 2015

(30) Foreign Application Priority Data

Apr. 21, 2014  (SG) .......................... 10201401676X

(51) Int. Cl.
| | |
|---|---|
| H01L 29/82 | (2006.01) |
| H01L 43/08 | (2006.01) |
| H01L 43/02 | (2006.01) |
| H01L 43/10 | (2006.01) |
| H01L 43/12 | (2006.01) |

(52) U.S. Cl.
CPC ................ *H01L 43/08* (2013.01); *H01L 43/02* (2013.01); *H01L 43/10* (2013.01); *H01L 43/12* (2013.01)

(58) Field of Classification Search
CPC ......... H01L 43/02; H01L 43/10; H01L 43/12; H01L 43/08
USPC ........................................................ 257/421
See application file for complete search history.

(56) References Cited

U.S. PATENT DOCUMENTS

| | | |
|---|---|---|
| 8,072,800 B2 | 12/2011 | Chen et al. |
| 8,558,331 B2 | 10/2013 | Zhu et al. |
| 8,604,572 B2 | 12/2013 | Wang et al. |
| 2007/0263429 A1 | 11/2007 | Yamamoto et al. |
| 2009/0096042 A1 | 4/2009 | Rizzo et al. |

*Primary Examiner* — Douglas Menz
(74) *Attorney, Agent, or Firm* — Brooks, Cameron & Huebsch, PLLC

(57) ABSTRACT

Spin transfer torque memory cells and methods of forming the same are described herein. As an example, spin transfer torque memory cells may include an amorphous material, a storage material formed on the amorphous material, wherein the storage material is substantially boron free, an interfacial perpendicular magnetic anisotropy material formed on the storage material, a reference material formed on the interfacial perpendicular magnetic anisotropy material, wherein the reference material is substantially boron free, a buffer material formed on the reference material and a pinning material formed on the buffer material.

18 Claims, 2 Drawing Sheets

SPIN TRANSFER TORQUE MEMORY CELLS

PRIORITY INFORMATION

This application claims priority to a Singapore Patent Application Serial No. 11201401676X filed Apr. 21, 2014, the specification of which are incorporated herein by reference.

TECHNICAL FIELD

The present disclosure relates generally to semiconductor memory apparatuses and methods and more particularly to spin transfer torque memory cells.

BACKGROUND

There are many different types of memory, including random-access memory (RAM), read only memory (ROM), dynamic random access memory (DRAM), synchronous dynamic random access memory (SDRAM), flash memory, resistance variable memory, such as phase change random access memory (PCRAM) and resistive random access memory (RRAM), and magnetic random access memory (MRAM), such as spin transfer torque random access memory (STT RAM), among others.

MRAM devices can employ a storage material that can be viewed as a multi-state resistor due to different relative orientations e.g., parallel and antiparallel, of the magnetic moments, which can change the magnitude of a current passing through the device. The storage material can transition the between different relative orientations. For example, in a write process, currents passing through conductive lines. e.g., word and/or bit lines, can be used to switch a magnetic orientation of the storage material, which can place the device in a high or low resistance state. A read process can then be used to determine the state of cell. For the STT memory cells, spin transfer torque, which can also be referred to as spin transfer switching, can be utilized to switch a magnetic orientation of the storage material, thus changing a resistance of the STT memory cell.

STT utilizes spin-polarized current, e.g., a current where most of the electrons have spins aligned in the same direction, which is applied to the storage material. The electrons may get repolarized due to the orientation of the magnetic moments of the storage layer. This repolarizing of the electrons can lead to the storage material experiencing a torque associated with the change in the angular momentum of the electrons as they are repolarized. As a result, if the current density is high enough, this torque has enough energy to switch the orientation, e.g., the direction, of the magnetization of the storage material. The advantages of using STT memory cells can include a smaller footprint, reduced space requirements, less number of steps in writing as compared with other writing techniques, scalability for large arrays, and/or lower writing current requirement, among others, as compared to some other memory cells.

DETAILED DESCRIPTION

Figure 1:
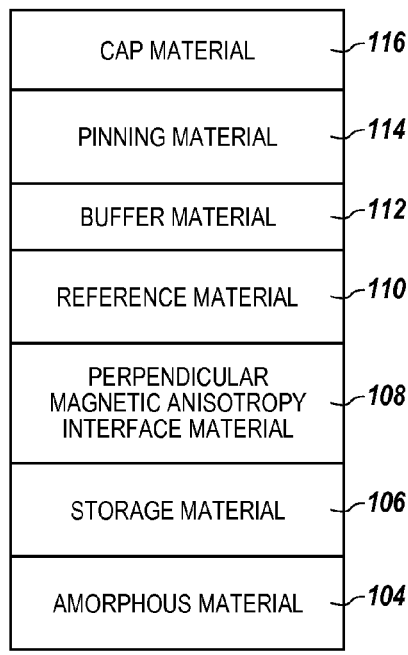
FIG. 1 illustrates a cross-sectional view of a portion of a spin transfer torque memory cell in accordance a number of embodiments of the present disclosure.

Spin transfer torque memory (STT) cells and methods of forming the same are described herein. As an example, a STT cell can include an amorphous material, a storage material formed on the amorphous material, wherein the storage material is substantially boron free, an interfacial perpendicular magnetic anisotropy (IPMA) material formed on the storage material, a reference material formed on the IPMA material, wherein the reference material is substantially boron free, a buffer material formed on the reference material and a pinning material formed on the buffer material. As disused further, the STT memory cells disclosed herein can be formed by a process that includes forming an amorphous material, forming a pre-storage material that contains boron on the amorphous material, forming an IPMA material on the pre-storage material, and annealing the amorphous material, the pre-storage material, and the IPMA material at a temperature in a range of about 500 degrees Celsius (° C.) to about 700° C.

Embodiments of the present disclosure can provide STT memory cells having a storage material, an IPMA material formed on the storage material, and a reference material formed on the IPMA material where each of the storage material, the IPMA material, and the reference material are substantially boron free and each have a desired, e.g., nearly perfect, body centered cubic (bcc) structure oriented to (001) that corresponds to being substantially boron free. Additionally, the IPMA material can have a lattice constant value that is substantially equal to a relaxed, e.g., bulk, lattice constant value of the IPMA material. Advantageously, providing that each of the storage material, the IPMA material, and the reference material have a desired bcc structure oriented to (001) can provide an improved tunneling magnetoresistance (TMR) ratio, an improved, e.g. stronger, perpendicular magnetic anisotropy, and/or an improved reliability of a tunnel barrier, e.g. associated with the IPMA material, as compared to some other STT cells. Herein, TMR ratio is defined as dR/R, where R is a minimum resistance of the STT memory cell and dR is the change in resistance observed by changing the magnetic orientation of the storage material. For instance, some examples of the present disclosure provide that the memory cells have an improved TMR ratio, e.g., a TMR ratio that is 150 percent greater than other STT cells. The STT memory cells disclosed herein can be formed by a process including at least two annealings, as discussed further herein.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 106 may reference element "6" in FIG. 1, and a similar element may be referenced as 206 in FIG. 2.

FIG. 1 illustrates a cross-sectional view of a portion of a STT memory cell 102 in accordance with a number of embodiments of the present disclosure. The memory cells disclosed herein, e.g. memory cell 102, can be formed using various processing techniques such as sputtering, atomic material deposition (AMD), e.g., atomic layer deposition, physical vapor deposition (PVD), chemical vapor deposition (CVD), supercritical fluid deposition (SFD), annealing, patterning, etching, filling, chemical mechanical planarization (CMP), combinations thereof, and/or other suitable processes. In accordance with a number of embodiments of the present disclosure, materials may be grown in situ.

The memory cell 102 includes an amorphous material 104. The amorphous material 104 may be referred to as a seed material. The amorphous material 104 can accommodate boron that is diffused from a different material that is formed on, e.g., subsequent to, the amorphous material 104. For example, during annealing boron may diffuse from a material formed on the amorphous material 104 into the amorphous material 104. Advantageously, the amorphous material 104 does not impede crystallization of a different material that is formed on the amorphous material 104. Examples of the present disclosure provide that the amorphous material 104 will remain substantially amorphous, e.g., substantially non-crystalline, after exposure to temperatures up to about 700° C.

The amorphous material 104 can include: W (tungsten) alloyed with Fe (iron), Co (cobalt), and/or Ni (nickel); CoFe alloyed with one or more transition elements having an affinity for B (boron); B; Hf (hafnium) alloyed with Fe, Co, and/or Ni; and/or Zr (zirconium) alloyed with Fe, Co, and/or Ni, among others for example. The amorphous material 104 can have a thickness in a range from about 1 nanometer (nm) to about 10 nm; all individual values and subranges from and including about 1 nm to about 10 nm are included herein and disclosed herein.

The memory cell 102 includes a storage material 106. The storage material 106 can switch magnetic orientation, e.g., during a write operation via application of a current, which can place the cell 102 in a high or low resistance state. A read process can then be used to determine the state of cell 102.

As shown in FIG. 1, the storage material 106 is formed on, e.g., in contact with, the amorphous material 104. However, examples of the present disclosure are not so limited. For instance, one or more intervening materials, not shown in FIG. 1, may separate a material formed on another material, such as the storage material 106 and the amorphous material 104, among others.

Some examples of the present disclosure provide that the storage material 106 can be formed by annealing a pre-storage material. Some examples of the present disclosure provide that the storage material 106 is substantially boron free. For instance, a pre-storage material including CoFeB can be formed on the amorphous material 104. As will be discussed further, annealing can provide that boron, from the pre-storage material is diffused to the amorphous material 104 to form the storage material 106. The pre-storage material can include Fe, Co, B, Ni, Mn, Dy, Nd, Y, Sm, Gd, and/or their alloys, for example. Because the boron is diffused to the amorphous material 104, the storage material 106 is substantially boron free.

The storage material 106 can be a magnetic material, e.g. a ferromagnetic material, such as CoFe, among others. For instance, the storage material 106 can include Fe, Co, Ni, Mn (manganese), Dy (dysprosium), Nd (neodymium), Y (yttrium), Sm (samarium), Gd (gadolinium), and/or their alloys. The storage material 106 can have a thickness in a range from about 1.2 nm to about 1.4 nm; all individual values and subranges from and including about 1.2 nm to about 1.4 nm are included herein and disclosed herein.

As mentioned, the memory cell 102 can include an IPMA material 108. The IPMA material 108, which may also be referred to as a tunnel barrier material, can be formed on the storage material 106. The IPMA material 108 can provide tunneling of electrons through the material. Some examples of the present disclosure provide that the IPMA material 108 can be a non-magnetic material. Examples of the IPMA material 108 include oxides or nitrides of Al (aluminum), Mg (magnesium), Si (silicon), Hf (hafnium), Sr (strontium), Zr (zirconium), Zn (zinc), or Ti (titanium) such as, MgO, $ZrO_x$, ZnO, $SiO_x$, $SiN_x$, $SiO_xN_y$, $AlO_x$, $TiO_x$, $AlN_x$, and/or combinations thereof, among others.

The STT memory cells disclosed herein can be formed by a process including at least two annealings. For instance, one of the at least two annealings can be performed after the IPMA material 108 is formed on the pre-storage material, e.g. a material that is utilized to form the storage material 106, which is formed on the amorphous material 104. This annealing, which may also be referred to as heat treatment, can be performed at a temperature in a range of about 500° C. to about 700° C.; all individual values and subranges from and including about 500° C. to about 700° C. are included herein and disclosed herein. This annealing of the IPMA material 108, the pre-storage material, and the amorphous material 104 can be performed for a time interval of about 2 minutes to about 1 hour; all individual values and subranges from and including about 2 minutes to about 1 hour are included herein and disclosed herein. In contrast to some other processes, which form a storage material on tantalum for example, this high temperature annealing can be utilized because the amorphous material 104 will not impede crystal formation of the storage material 106 at these high temperatures. Advantageously, this high temperature annealing helps to promote improved crystal structure of both the storage material 106 and the IPMA material 108, as compared to some other processes.

This annealing of the IPMA material 108, the pre-storage material, and the amorphous material 104 can cause boron from the pre-storage material, e.g., CoFeB, which is utilized to form the storage material 106, to diffuse into the amorphous material 104. As such, the storage material 106 is substantially boron free. For instance, following the annealing the storage material 106 may contain less than about 10 percent residual boron, less than about 7 percent residual boron, less than about 5 percent residual boron, or even less residual boron, as compared to the pre-storage material. Additionally, this annealing, i.e., high temperature annealing at a temperature in a range of about 500° C. to about 700° C., can help to relax a lattice constant of the IPMA material 108. For example, this annealing can provide that the IPMA material 108 has a lattice constant value, e.g. a relaxed lattice constant value, which is substantially equal to a bulk lattice constant value of the IPMA material 108, e.g., a lattice constant value of the IPMA material 108 in isolation. Because the IPMA material 108 has the lattice constant value that is substantially equal to a bulk lattice constant value of the IPMA material 108, the IPMA material 108 will have better spin-filtering properties, indicated by an improved TMR ratio of 150 percent or more, as compared to some other spin-filtering materials formed by processes not including this annealing. Further, the IPMA material 108 can be considered a template from which the storage material 106 starts to crystallize. Because the IPMA material 108 is more perfectly crystalline, as compared to some other spin-filtering materials formed by processes not including this annealing, the IPMA material 108 will have relatively fewer defects and dislocations and as such the storage material 106 will also have an improved crystallinity.

The memory cell 102 can include a reference material 110. The reference material 110 can be formed on the IPMA material 108, e.g., subsequent to the annealing of the IPMA material 108, the material that is utilized to form the storage material 106, and the amorphous material 104. The reference material can be configured to maintain a particular magnetic orientation, e.g. by coupling to a pinning material discussed further herein. As such, the reference material 110 can be utilized as a fixed reference for the storage material 106, e.g., to define a high resistance state and/or a low resistance state, which can correspond to a data state "1" and/or a data state "0", respectively, for example.

The reference material 110 can be a magnetic material, e.g. a ferromagnetic material, such as CoFe, among others. For instance, the reference material 110 can include Fe, Co, Ni, Mn, Dy, Nd, Y, Sm, Gd, and/or their alloys. Some examples of the present disclosure provide that the reference material 110 is substantially boron free. For instance, a pre-reference material, e.g., a material including CoFeB, which can be used to form the reference material 110, can be formed on the PMAI material 108. The pre-reference material can include Fe, Co, B, Ni, Mn, Dy, Nd, Y, Sm, Gd, and/or their alloys, for example. As will be discussed further, annealing can provide that boron, e.g., from the pre-reference material, is diffused from the pre-reference material to a buffer material to form the reference material 110. Because the boron is diffused to the buffer material, the reference material 110 is substantially boron free. The reference material 110 can have a thickness from about 1.2 nm to about 1.4 nm; all individual values and subranges from and including about 1.2 nm to about 1.4 nm are included herein and disclosed herein.

The memory cell 102 can include a buffer material 112. The buffer material 112 can be formed on the reference material 110. The buffer material 112 can accommodate boron that is diffused, e.g., diffusion during annealing, from the pre-reference material, such as CoFeB, which is used to form the reference material 110.

The buffer material 112 can be utilized to couple the reference material 110 with a material formed subsequent to the buffer material, e.g., a pinning material as discussed further herein. Further, the buffer material 112 can be utilized to interrupt a crystal structure of the reference material 110. For instance, some examples of the present disclosure provide that the reference material 110 includes CoFe, which has a body-centered cubic structure oriented to (001); however, the pining material can have a different crystal structure, e.g., face-centered cubic oriented to (111).

The buffer material 112 can include Ta (tantalum); W alloyed with Fe, Co, and/or Ni; Fe/Co alloyed with one or more transition elements having an affinity for B; Hf alloyed with Fe, Co, and/or Ni; and/or Zr alloyed with Fe, Co, and/or Ni, among others for example. The buffer material 112 can have a thickness in a range from about 0.1 nm to about 3.0 nm; all individual values and subranges from and including about 0.1 nm to about 3.0 nm are included herein and disclosed herein.

As mentioned, the STT memory cells disclosed herein can be formed by a process including at least two annealings. For instance, another of the at least two annealings can be performed after the buffer material 112 is formed on the pre-reference material that is utilized to form the reference material 110. This annealing can be performed at a temperature in a range of about 350° C. to about 700° C.; all individual values and subranges from and including about 350° C. to about 700° C. are included herein and disclosed herein. This annealing, e.g. heat treatment of the IPMA material 108, the storage material 106, the amorphous material 104, the buffer material 112, and the pre-reference material can be performed for a time interval of about 2 minutes to about 1 hour; all individual values and subranges from and including about 2 minutes to about 1 hour are included herein and disclosed herein.

This annealing can cause boron from the pre-reference material to diffuse into the buffer material 112. As such, the reference material 110 is substantially boron free. For instance, following the annealing the reference material 110 may contain less than about 10 percent residual boron, less than about 7 percent residual boron, less than about 5 percent residual boron, or even less residual boron, as compared to the material that is utilized to form the reference material 110. Additionally, this annealing can provide that the reference material 110 is crystallized with an improved crystallinity by utilizing the IPMA material 108 as a crystal template, e.g., a body-centered cubic structure oriented to (001).

As mentioned, the memory cell 102 can include a pinning material 114. The pinning material 114 can be formed on the buffer material 112. The pinning material 114 can be an antiferromagnetic material. The pinning material 114 can help maintain the reference material 110 in a particular magnetic orientation. The pinning material 110 can include Co, Ni, Pt (platinum), Pd (palladium), including for example, CoNi, CoPt, CoPd, or compounds thereof, among others. Advantageously, the STT memory cells disclosed herein, which can be formed by a process including at least two annealings, one of which is an annealing at a temperature in a range of about 500° C. to about 700° C., do not have a decreased TMR due to diffusion, e.g., Pt and/or Pd diffusion, from the pinning material 114, as compared to some other cells formed by other processes.

The memory cell 102 can include a cap material 116. The cap material 116 can be formed on the pinning material 114. The cap material 116 can include a conductive material, e.g., a metal, such as titanium nitride, tantalum nitride, platinum, copper, tungsten, tungsten nitride, and/or ruthenium, among other conductive materials and/or combinations thereof.

Figure 2:
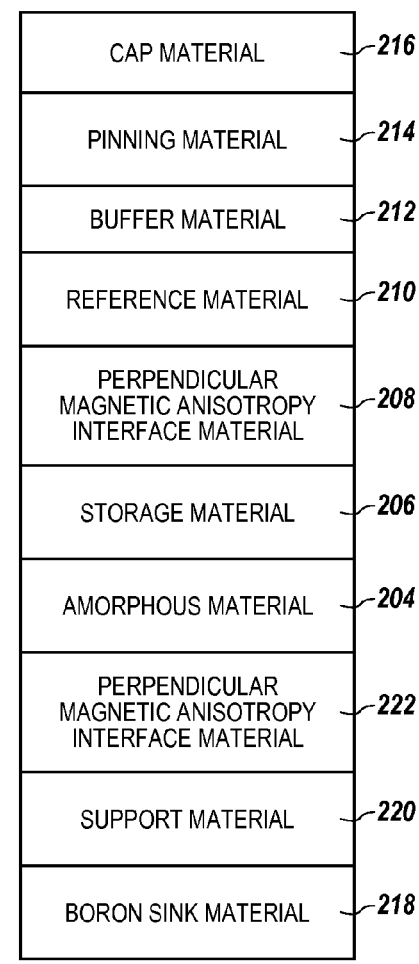
FIG. 2 illustrates a cross-sectional view of a portion of a spin transfer torque memory cell in accordance a number of embodiments of the present disclosure.

FIG. 2 illustrates a cross-sectional view of a portion of a spin transfer torque memory cell 203 in accordance a number of embodiments of the present disclosure. As illustrated in FIG. 2, the memory cell 203 can include boron sink material 218. The boron sink material 218 can accommodate boron that is diffused from a different material that is formed on, e.g., subsequent to, the boron sink material 218, such as diffusion during annealing. The boron sink material 218 can include Ta, B; W alloyed with Fe, Co, and/or Ni; Fe/Co alloyed with one or more transition elements having an affinity for B; Hf alloyed with Fe, Co, and/or Ni; and/or Zr alloyed with Fe, Co, and/or Ni, among others for example.

The memory cell 203 can include a support material 220. The support material 220 can support crystal growth of a material, e.g., an IPMA material, thereon. The support material 220 can be a magnetic material, e.g. a ferromagnetic material, such as CoFe, among others. For instance, the support material 220 can include Fe, Co, Ni, Mn, Dy, Nd, Y, Sm, Gd, and/or their alloys. Some examples of the present disclosure provide that the support material 220 is substantially boron free. For instance, a pre-support material, e.g., including CoFeB, can be formed on the boron sink material 218. The pre-support material can include Fe, Co, B, Ni, Mn, Dy, Nd, Y, Sm, Gd, and/or their alloys, for example. As will be discussed further, annealing can provide that boron, from the pre-support material is diffused to the boron sink material 218 to form the support material 220. Because the boron is diffused to the boron sink material 218, the support material 220 is substantially boron free. The support material 220 can have a thickness in a range from about 0.5 nm to about 0.7 nm; all individual values and subranges from and including about 0.5 nm to about 0.7 nm are included herein and disclosed herein.

The memory cell 203 can include an IPMA material 222, e.g. a first IPMA material. As illustrated in FIG. 2, the IPMA material 222 can be formed on the support material 220, which supports crystal growth of the IPMA material 222. The IPMA material 222 can include oxides or nitrides of Al (aluminum), Mg (magnesium), Si (silicon), Hf (hafnium), Sr (strontium), Zr (zirconium), Zn (zinc), or Ti (titanium) such as, MgO, $ZrO_x$, ZnO, $SiO_x$, $SiN_x$, $SiO_xN_y$, $AlO_x$, $TiO_x$, $AlN_x$, and/or combinations thereof, among others.

Some examples of the present disclosure provide that an annealing can be performed after the IPMA material 222 is formed on the pre-support material. This annealing can be performed at a temperature in a range of about 350° C. to about 700° C.; all individual values and subranges from and including about 350° C. to about 700° C. are included herein and disclosed herein. This annealing, e.g. heat treatment of the IPMA material 222, the pre-support material, and the boron sink material 218 can be performed for a time interval of about 2 minutes to about 1 hour; all individual values and subranges from and including about 2 minutes to about 1 hour are included herein and disclosed herein.

As illustrated in FIG. 2, the memory cell 203 can include an amorphous material 204, a storage material 206, and an IPMA material 208. However, because the memory cell 203 includes two IPMA materials, i.e. IPMA material 222 and IPMA material 208, additional spin torque, as compared to a cell 102 with a single IPMA material 108, can be provided to switch magnetic orientation of the storage material 206. As such, for some applications, a cell 203 including two IPMA materials 222, 208 can have a thicker storage material 206, relative to a cell 102 with a single IPMA material 108. As discussed herein, an annealing, e.g., an annealing at a temperature in a range of about 500° C. to about 700° C., can be performed after the IPMA material 208 is formed, for instance, prior to formation of a pre-reference material on the IPMA material 208.

The amorphous material 204 can have a thickness in a range from about 0.2 nm to about 0.7 nm; all individual values and subranges from and including about 0.2 nm to about 0.7 nm are included herein and disclosed herein. The storage material 206 can have a thickness in a range from about 1.3 nm to about 1.5 nm; all individual values and subranges from and including about 1.3 nm to about 1.5 nm are included herein and disclosed herein.

The memory cell 203 can include a reference material 210 and a buffer material 212. Some examples of the present disclosure provide that an annealing can be performed after the buffer material 212 is formed on a material that is utilized to form the reference material 210, e.g., the pre-reference material. This annealing can be performed at a temperature in a range of about 350° C. to about 700° C.; all individual values and subranges from and including about 350° C. to about 700° C. are included herein and disclosed herein. This annealing can be performed for a time interval of about 2 minutes to about 1 hour; all individual values and subranges from and including about 2 minutes to about 1 hour are included herein and disclosed herein. The memory cell 203 can include a pinning material 214 and a cap material 216.

Figure 3:
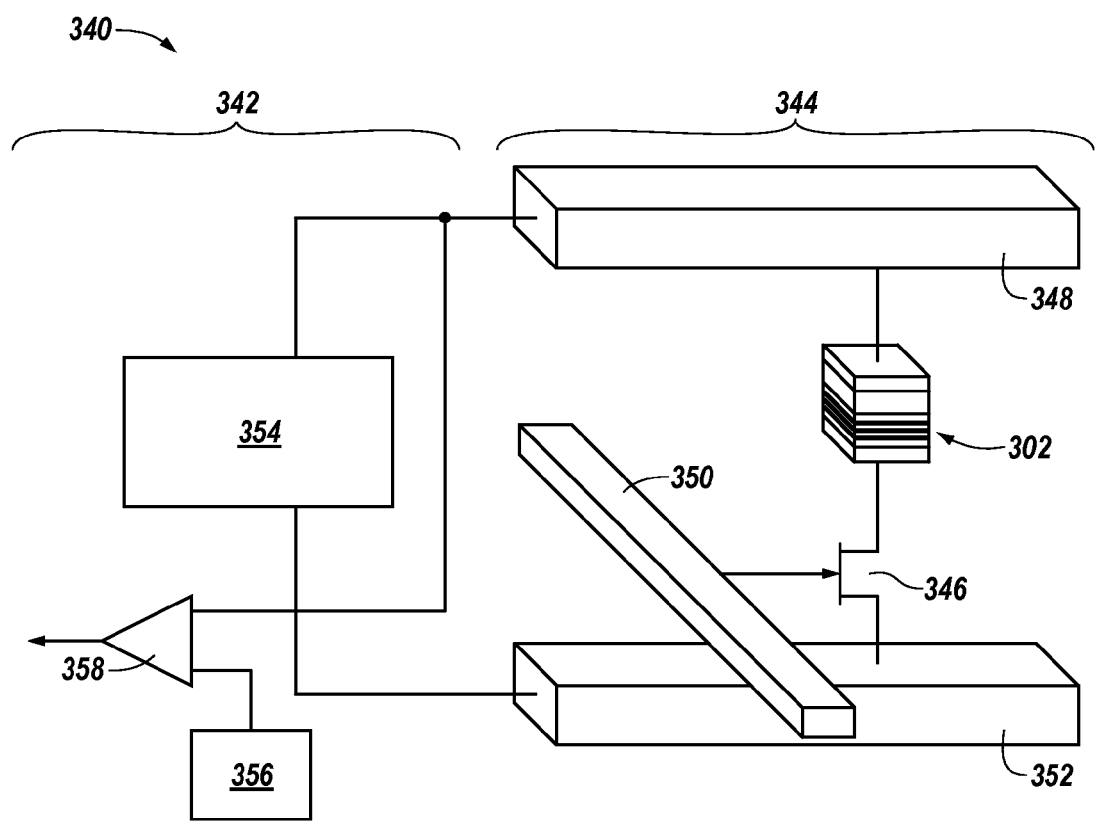
FIG. 3 illustrates an example of a portion of a memory system associated with spin transfer torque memory cells in accordance with one or more embodiments of the present disclosure.

FIG. 3 illustrates an example of a portion of a memory system 340 associated with spin transfer torque memory cells in accordance with one or more embodiments of the present disclosure. The system 340 can include peripheral devices 342 that are in operable communication with a cell 344, a plurality of which may be fabricated to form an array of memory cells in a grid pattern, e.g., including a number of rows and columns, or in various other arrangements, depending on the system application and/or fabrication technology. The cell 344 can include the portion of the STT memory cell 302, an access transistor 346, a conductive material that may function as a data/sense line 348 (e.g., a bit line), a conductive material that may function as an access line 350 (e.g., a word line), and a conductive material that may function as a source line 352. While not illustrated in FIG. 3, examples of the present disclosure provide that the cell 344 can include the portion of the STT memory cell 203. The peripheral devices 342 of the system 340 may include read/write circuitry 354, a bit line reference 356, and a sense amplifier 358.

In operation, a cell 344 can be selected to be programmed so that a programming current is applied to the cell 344. The programming current can be spin-polarized, as discussed herein, to switch the orientation, e.g., the direction, of the magnetization of the storage material to perform a "write to" or "program" operation. In a read operation of the cell 344, a current can used to detect a resistance associated with the cell 344.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A spin transfer torque memory cell, comprising:
   an amorphous material, wherein the amorphous material accommodates diffused boron;
   a storage material formed on the amorphous material, wherein the storage material is substantially boron free;
   an interfacial perpendicular magnetic anisotropy material formed on the storage material;
   a reference material formed on the interfacial perpendicular magnetic anisotropy material, wherein the reference material is substantially boron free;
   a buffer material formed on the reference material; and
   a pinning material formed on the buffer material.

2. The spin transfer torque memory cell of claim 1, wherein the storage material comprises CoFe.

3. The spin transfer torque memory cell of claim 1, wherein the amorphous material comprises W alloyed with Fe, Co.

4. The spin transfer torque memory cell of claim 1, wherein the amorphous material comprises CoFe alloyed with a transition element.

5. The spin transfer torque memory cell of claim 1, wherein the amorphous material comprises Hf alloyed with Fe, Co, and/or Ni.

6. The spin transfer torque memory cell of claim 1, wherein the amorphous material comprises Zr alloyed with Fe, Co, and/or Ni.

7. The spin transfer torque memory cell of claim 1, wherein the reference material comprises CoFe.

8. The spin transfer torque memory cell of claim 1, wherein the interfacial perpendicular magnetic anisotropy material comprises MgO.

9. The spin transfer torque memory cell of claim 1, wherein the storage material, the interfacial perpendicular magnetic anisotropy material, and the reference material each have a body-centered cubic structure oriented to (001).

10. The spin transfer torque memory cell of claim 1, wherein a pre-storage material that forms the storage material and the interfacial perpendicular magnetic anisotropy material are annealed at a temperature in a range of about 500° C. to about 700° C. prior to formation of the reference material.

11. The spin transfer torque memory cell of claim 10, wherein a pre-reference material that forms the reference material and the buffer material are annealed at a temperature in a range of about 350° C. to about 700° C. prior to formation of the pinning material.

12. A spin transfer torque memory cell, comprising:
a boron sink material;
a support material formed on the boron sink material;
a first interfacial perpendicular magnetic anisotropy material formed on the support material;
an amorphous material formed on the first interfacial perpendicular magnetic anisotropy material, wherein the amorphous material accommodates diffused boron;
a storage material formed on the amorphous material, wherein the storage material is substantially boron free;
a second interfacial perpendicular magnetic anisotropy material formed on the storage material;
a reference material formed on the second interfacial perpendicular magnetic anisotropy material, wherein the reference material is substantially boron free;
a buffer material formed on the reference material; and
a pinning material formed on the buffer material.

13. The spin transfer torque memory cell of claim 12, wherein the amorphous material has a thickness in a range from about 0.2 nm to about 0.7 nm.

14. The spin transfer torque memory cell of claim 12, wherein the storage material has a thickness in a range from about 1.3 nm to about 1.5 nm.

15. A method of forming a spin transfer torque memory cell, the method comprising:
forming an amorphous material, wherein the amorphous material can accommodate diffused boron;
forming a pre-storage material containing boron on the amorphous material;
forming an interfacial perpendicular magnetic anisotropy material on the pre-storage material;
forming a storage material on the amorphous material, wherein the storage material is substantially boron free;
forming a second interfacial perpendicular magnetic anisotropy material on the storage material;
forming a reference material on the second interfacial perpendicular magnetic anisotropy material, wherein the reference material is substantially boron free;
forming a buffer material on the reference material; and
forming a pinning material on the buffer material.

16. The method of claim 15, comprising:
annealing the amorphous material, the pre-storage material, and the interfacial perpendicular magnetic anisotropy material at a temperature in a range of about 500° C. to about 700° C., wherein annealing the pre-storage material causes boron to diffuse from the pre-storage material to the amorphous material to form the storage material that contains less than about 10 percent residual boron from the pre-storage material.

17. The method of claim 16, comprising:
forming a pre-reference material containing boron on the interfacial perpendicular magnetic anisotropy material; and
forming a buffer material on the pre-reference material; and
annealing the pre-reference material and the buffer material at a temperature in a range from in a range of about 350° C. to about 700° C.

18. The method of claim 17, wherein annealing the pre-reference material causes boron to diffuse from the pre-reference material to the buffer material to form a reference material that is substantially boron free between the interfacial perpendicular magnetic anisotropy material and the buffer material.

* * * * *